United States Patent
O'Connor et al.

(10) Patent No.: US 7,859,308 B2
(45) Date of Patent: Dec. 28, 2010

(54) RECONFIGURABLE LOGIC CELL MADE UP OF DOUBLE-GATE MOSFET TRANSISTORS

(75) Inventors: Ian D. O'Connor, Jassans-Riottier (FR); Ilham Hassoune, Fontainebleau (FR)

(73) Assignees: Ecole Centrale de Lyon, Eully Cedex (FR); Centre National de la Recherche Scientifique (CNRS), Paris Cedex 16 (FR)

( * ) Notice: Subject to any disclaimer, the term of this patent is extended or adjusted under 35 U.S.C. 154(b) by 0 days.

(21) Appl. No.: 12/668,135

(22) PCT Filed: Jul. 11, 2008

(86) PCT No.: PCT/FR2008/051309

§ 371 (c)(1),
(2), (4) Date: Feb. 17, 2010

(87) PCT Pub. No.: WO2009/013422

PCT Pub. Date: Jan. 29, 2009

(65) Prior Publication Data

US 2010/0194430 A1      Aug. 5, 2010

(30) Foreign Application Priority Data

Jul. 13, 2007      (FR) .................................. 07 56487

(51) Int. Cl.
*H03K 19/00*      (2006.01)
(52) U.S. Cl. .............................. 326/93; 326/97; 326/98; 326/104; 326/114; 326/121
(58) Field of Classification Search .................. 326/93, 326/95–98, 104, 112, 114
See application file for complete search history.

(56) References Cited

U.S. PATENT DOCUMENTS

| | | | |
|---|---|---|---|
| 5,126,950 A | 6/1992 | Rees et al. | |
| 5,777,491 A | 7/1998 | Hwang et al. | |
| 7,592,841 B2* | 9/2009 | Kapoor | 326/121 |
| 7,652,330 B1* | 1/2010 | Hackler et al. | 257/347 |
| 2003/0112035 A1* | 6/2003 | Bernstein et al. | 326/95 |
| 2004/0041588 A1 | 3/2004 | Choe | |
| 2006/0290384 A1* | 12/2006 | Chuang et al. | 326/97 |
| 2007/0013413 A1* | 1/2007 | Chiang et al. | 326/121 |
| 2007/0040584 A1* | 2/2007 | Ngo et al. | 326/98 |

* cited by examiner

*Primary Examiner*—James H. Cho
*Assistant Examiner*—Jason M Crawford
(74) *Attorney, Agent, or Firm*—Dennison, Schultz & Macdonald

(57) ABSTRACT

Reconfigurable logic cells based on dual gate MOSFET transistors (DG MOSFETs) including n inputs (A,B), n being greater than or equal to 2 and capable of performing at least four logic functions with which logical signals provided on the n inputs (A,B) may be processed. The cell contains, between the ground and the output (F) of the cell, at least one first branch including n dual gate N-type MOSFET transistors (M1,M2) in series and n−1 branches in parallel with the first branch, each provided with a dual gate N-type MOSFET transistor (M3), each of the logic functions corresponding to a given configuration of the cell. A specific set of control signals (C1,C2) is applied on the rear gates of at least one portion of the transistors (M2,M3), each control signal (C1, C2) being capable of setting the transistor (M2,M3) to a particular operating mode.

15 Claims, 6 Drawing Sheets

US 7,859,308 B2

RECONFIGURABLE LOGIC CELL MADE UP OF DOUBLE-GATE MOSFET TRANSISTORS

CONTINUATION DATA

This Application is a 371 of PCT/FR2008/051309 filed on Jul. 11, 2008.

BACKGROUND OF THE INVENTION

The present invention relates to the general field of reconfigurable logic cells comprising a plurality of inputs and capable of performing a certain number of logic functions with which logic signals provided on their inputs may be processed.

More specifically, the invention proposes reconfigurable logic cells with reduced production costs.

The production costs of integrated circuits is essentially due to the cost of the design of the masks useful for lithography and to the cost of automatic equipment used for producing integrated circuits, notably photolithography devices.

These production costs regularly increase with the present trends towards miniaturization and complexity of the architectures. Also, more and more sophisticated devices are required in order to meet a certain number of problems generated by miniaturization which generates problems of leakage currents and behavior reliability. All this considerably complexifies the design of the masks.

Dedicated circuits, for example ASIC (Application Specific Integrated Circuit) circuits which exist since the nineteen seventies, have very high integration density and are designed for a specific application. Their design is long and costly and the slightest design error requires a new revision of the circuit.

In order to guarantee larger flexibility, programmable circuits have been developed. They provide good tolerance to errors and allow reuses for different applications. In particular, the masks may be reused in various contexts. Different types of architecture exist for such circuits, for example FPGA (Field Programmable Gate Array), CPLD (Complex Programmable Logic Device) or further PLA (Programmable Logic Array) circuits. They appeared in the nineteen eighties (EP-A-0 264 334, FAIRCHILD SEMICONDUCTOR [US], Apr. 20$^{th}$ 1988).

Their less complex flexibility and design than those of dedicated circuits such as ASICs, have made these circuits popular in the industrial environment. They are often known as "universal functions". Such programmable circuits use complementary static CMOS logic. With these circuits, it is possible to connect together basic components which are the basic logic functions.

It is thus possible to produce any logic function desired by the user, but these programmable circuits remain nevertheless greatly disadvantaged in comparison with ASICs in terms of performance and consumption.

Indeed, the latter are generally optimized in order to operate at high speed and/or low consumption, which is not the case for programmable circuits which use interconnection networks for connecting the different basic components and are therefore handicapped by parasitic capacitances provided by these interconnections between the basic components.

Today there exist other logic styles for implementing the basic components and with which reconfigurable cells may be made. The implementation of such reconfigurable cells instead of conventional logic cells, gives the possibility of contemplating reduction of the interconnections and access to full use of the resources for the computation.

This is beneficial in terms of performance and consumption but also in terms of costs, since the silicon surface and the number of metal layers required for routing interconnections are reduced.

With these approaches it is possible to produce a certain number of logic functions and they use Hall effect devices or further CNTFET (Carbon Nanotube FET) devices, or further RTD (Resonant Tunneling Diode) components, in combination with an HFET (Heterostructure FET) component.

However, some of these manufacturing processes are not mature, notably CNTFET technology, and some are complex and therefore costly, notably RTD/HFET and CMOS/Hall effect technologies.

Indeed, components using the Hall effect cannot be easily integrated with CMOS technology, which complicates manufacturing and makes it costly.

RTD components as for them are not compatible with CMOS technology, which implies external connections and complexification of the final circuit.

CNTFET components are difficult to utilize from an industrial point of view since this technology is not yet sufficiently mature for leading to industrial production.

Nevertheless it is true that there exists a great need for reconfigurable circuits, easy to design and integrate, and inexpensive, with which, by their possibility of being used in multiple applications, it would be possible to make the cost of the masks profitable in the medium term.

OBJECT AND SUMMARY OF THE INVENTION

The main object of the present invention is therefore to overcome such drawbacks by proposing a novel style of reconfigurable logic cells based on the use of dual gate MOSFET devices and allowing design with fine granularity of circuits based on programmable logic.

With the invention, it is also possible to reduce, relatively to conventional static CMOS logic, the number of transistors required for implementing the same functions. It also allows reduction of the interconnection network which is a handicap of programmable circuits based on conventional static CMOS logic.

With the invention, it is therefore possible to access high performance operation meeting present needs in reduction of consumption and in speed.

The present invention therefore proposes a reconfigurable logic cell comprising n inputs, n being greater than or equal to 2, and capable of producing at least four logic functions with which logic signals provided on the n inputs may be processed, characterized in that it comprises between the ground and the output of the cell, at least one first branch including n dual gate N type MOSFET transistors in series, and n−1 branches in parallel with the first branch, each provided with one dual gate N type MOSFET transistor, each of the logic functions corresponding to a given configuration of the cell where a specific set of control signals is applied on the rear gates of at least one portion of the transistors, each control signal being able to set the transistor to a particular operating mode, the n inputs being each connected on the front gate of one of the n transistors of the first branch, n−1 inputs being also applied on the front gate of one of the n−1 transistors, of the n−1 branches in parallel with the first branch.

On such a cell, the output of the cell therefore corresponds to the point common to the branches of the cell the most distant from the ground.

With such a reconfigurable logic cell, by using the bias of the rear gates of the transistors, the threshold voltage of these transistors may be adjusted so as to make them compatible with the desired function.

Each logic function is therefore made available in a configuration which depends on the biasing of the rear gates of certain transistors of the cell.

The logic style proposed in the invention provides a possibility of breaking away from the logic style customarily used for this kind of application and this, by only using dual gate MOSFET devices. It is possible to reproduce the required functionality of the switch by using a circuit structure based on MOS transistors with a single gate (U.S. Pat. No. 5,777,491, HWANG [US], Jul. 7, 1998), but this implies the use of six transistors and of interconnections connecting them, which significantly increases consumption, surface area and therefore price cost.

The concept of reconfigurability used in the invention provides a gain in terms of surface area. Indeed it allows a reduction in the number of logic cells required for implementing the same number of logic functions as compared with the implementation of these functions with conventional CMOS logic. Further, it provides reduction of the interconnection network. This also reduces the capacities due to routing in the interconnection network.

Dynamic consumption is therefore consequently reduced and speed is improved. A compromise is thereby achieved between performances in terms of speed and of consumption, and flexibility of use.

According to a first embodiment of the invention, n is equal to 2, a first input being connected to the connected gates of a first transistor of the first branch, a second input being connected to the front gate of the second transistor of the first branch, the gates of which are separate, and to the front gate of the transistor of the second branch, the gates of which are also separate, control signals applied on the rear gates of the second transistor of the first branch and of the transistor of the second branch allowing the cell to be made reconfigurable, capable of performing four functions.

According to a second embodiment of the invention, n is equal to 3 all the transistors being with separate gates, a first input being connected to the front gate of a first transistor of the first branch, a second input being connected to the front gate of a second transistor of the first branch and to the front gate of the transistor of the second branch, a third input being connected to the front gate of the third transistor of the first branch and to the front gate of the transistor of the third branch, five control signals applied on the rear gates of the five transistors allow the cell to be made reconfigurable, capable of performing eleven functions.

According to a particular characteristic of the invention, the control signals have a voltage selected from −Vdd, 0, +Vdd, Vdd being the power supply voltage of the cell.

This characteristic allows positioning of each transistor in its operating diagram by allowing permanent conduction or conduction controllable with the voltage applied on the front gate or further by totally blocking conduction regardless of the bias of the front gate.

In a first type of implementation of the invention, the reconfigurable cell is implemented in dynamic logic, the branches of the cell being put in series, between the ground and a power supply terminal, between a preload transistor of the P type (Mp) and an evaluation transistor of type N (Mn), the gates of which are controlled by a clock signal and in that the transistors of the n−1 branches in parallel with the first branch area asymmetrical. Dynamic logic has been already used successfully for producing fixed logic functions. By coupling this logic style with the technique of differential logic (US 2004/041588A1, CHOE SWEE YEW [US], Mar. 4, 2004), it is possible to reduce consumption and surface area. However, circuits obtained by this method are not reconfigurable.

By "a symmetrical dual gate MOSFET transistor" is meant a dual gate MOSFET transistor in which the gate oxide thicknesses for the front and rear gates or more generally for which the operating functions are symmetrical and by "asymmetrical dual gate MOSFET transistor" is meant a dual gate MOSFET transistor in which the gate oxide thicknesses are different for the front and rear gates, or, more generally, for which the work functions are asymmetrical; this may be obtained by using two different materials for the front and rear gates.

Advantageously, in such a cell made in dynamic logic, all the transistors are asymmetrical.

With such a characteristic, the reconfigurable cell, according to the invention may be easily manufactured, since with this characteristic, a set of transistors all made with the same characteristics may be used.

According to another type of implementation, the reconfigurable cell is implemented in static logic, the branches of the cell being placed in series between the ground and a power supply terminal with a complementary network of transistors placed between the point common to the branches of the cell, the most distant from the ground forming the output of the cell and the power supply terminal.

More particularly, according to this type of implementation, n being equal to 2, the complementary network comprises between the power supply terminal and the output of the cell, a P type MOSFET transistor of the transistors of the branches of the cell in series with two P type MOSFET transistors mounted in parallel and both connected to the output of the cell, the first input being connected to the connected gates of a first P type transistor mounted in parallel, the second input being connected to the front gate of the second P type transistor mounted in parallel, the gates of which are separate and to the front gate of the P type transistor mounted in series, the gates of which are also separate, two control signals applied on the rear gates of the second P type transistor mounted in parallel and of the P type transistor mounted in series allowing the cell to be made reconfigurable capable of performing four functions.

According to an advantageous characteristic, for this type of implementation, as the transistors are all symmetrical, the ratio W/L of the P type transistor with separate grid mounted in parallel is adjusted for allowing blocking of this transistor when a voltage Vdd is applied on its rear gate.

According to another advantageous characteristic of the invention, the P type transistor with separated gate mounted in parallel is asymmetrical.

Advantageously, all the transistors are asymmetrical.

Concerning the embodiments in which one or more asymmetrical transistors are used, preferentially the asymmetry of the transistors is such that it allows an increase in the threshold voltage of the front gate, controlled by the input logic signal, relatively to that of the rear gate, controlled by the control signal of the logic function of the cell.

Advantageously, the asymmetry of the transistor(s) is selected so as to ensure a compromise between the stability of the operating modes of the transistor(s) and the functions performed by the cell with biasing voltages below the gate breakdown limit of the transistor(s).

Practically, the asymmetry of the transistors may be achieved with asymmetrical gates having different gate oxide thicknesses or further the asymmetrical gates are such that they have asymmetrical work functions.

Such asymmetrical work functions may for example be achieved by using distinct materials for making the two gates of the relevant transistors.

SHORT DESCRIPTION OF THE DRAWINGS

Other characteristics and advantages of the present invention will become apparent from the description made below, with reference to the appended drawings which illustrate an exemplary embodiment thereof without any limitation. In the figures.

DETAILED DESCRIPTION OF AN EMBODIMENT

Figure 1:
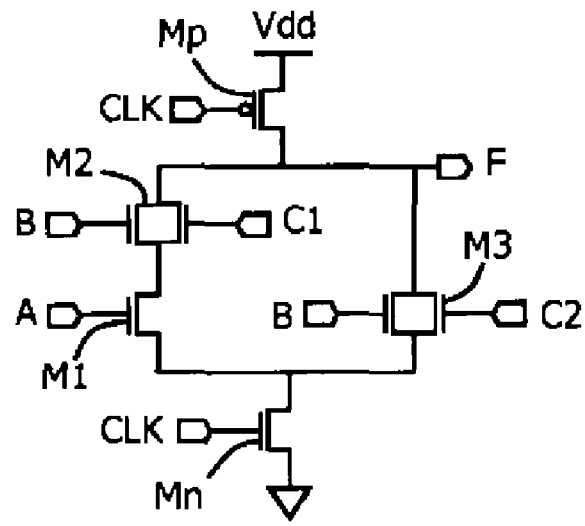
FIG. 1 illustrates a first exemplary embodiment of a reconfigurable cell made in dynamic logic according to the invention.

FIG. 1 schematically illustrates a dynamic reconfigurable cell with four logic functions handling two inputs A and B on which binary signals are provided capable of assuming a zero value "0" and a non-zero value "1".

The result of the logic function performed by the reconfigurable cell is provided on an output F which is the output of the cell.

The cell is made according to dynamic logic from a set of dual gate MOSFET devices.

In the exemplary embodiment of FIG. 1, the reconfigurable cell comprises five dual gate MOSFET transistors, noted as M1-M3, Mn and Mp.

Transistors M1, Mn and Mp are symmetrical dual gate MOSFET devices for which the front and rear gates are connected together. Since these transistors are symmetrical, their gate oxide thicknesses and their work function of the front and rear gates of these transistors are therefore also identical.

Transistor M2 is a symmetrical dual gate MOSFET device with separate gates. Transistor M3 is an asymmetrical dual gate MOSFET device also having separate gates.

The asymmetry of transistor M3 may be achieved by using different thicknesses for the front and rear gate oxides or by giving asymmetrical work functions to both gates of this transistor. Such distinct work functions may for example be achieved by using two different materials for the front and rear gates.

According to the invention, the transistors M1 and M2 are connected in series on a first branch of the reconfigurable cell and the transistor M3 is placed on a second branch in parallel with the first branch.

Both parallel branches are connected in series with both transistors Mn and Mp controlled with a clock signal CLK according to the principles used in dynamic logic. The preload transistor Mp is thus a P type transistor while the evaluation transistor Mn is an N type transistor.

The output of the cell F corresponds to the common point of both branches connected to the transistor M5 and therefore to the common point most distant from the ground.

According to the invention, the input A of the reconfigurable cell is connected to both gates of the transistor M1. The input B of the reconfigurable cell is connected to the front gates of the transistors M2 and M3.

Two control signals C1 and C2 which may assume the voltage values Vdd, 0 and −Vdd, Vdd being the power supply voltage, are respectively applied on the rear gate of the transistor M2 and on the rear gate of the transistor M3.

These signals C1 and C2 allow modification of the operating mode of the transistors M2 and M3 and thus modification of the logic function performed by the reconfigurable cell.

Table 1 hereafter summarizes the whole of the logic functions which may be performed by the reconfigurable cell of FIG. 1 by modifying the control signals C1 and C2 applied on the rear gates of the transistors M2 and M3.

TABLE 1

| C1 | C2 | F |
|---|---|---|
| 0 | −Vdd | NAND |
| Vdd | 0 | NOR |
| Vdd | −Vdd | NON-A |
| −Vdd | 0 | NON-B |

The truth tables of the NAND, NOR, NON-A and NON-B logic functions are given in Table 2.

TABLE 2

| A | B | NAND | NOR | NON-A | NON-B |
|---|---|---|---|---|---|
| 0 | 0 | 1 | 1 | 1 | 1 |
| 0 | 1 | 1 | 0 | 1 | 0 |
| 1 | 0 | 1 | 0 | 0 | 1 |
| 1 | 1 | 0 | 0 | 0 | 0 |

Figure 2:
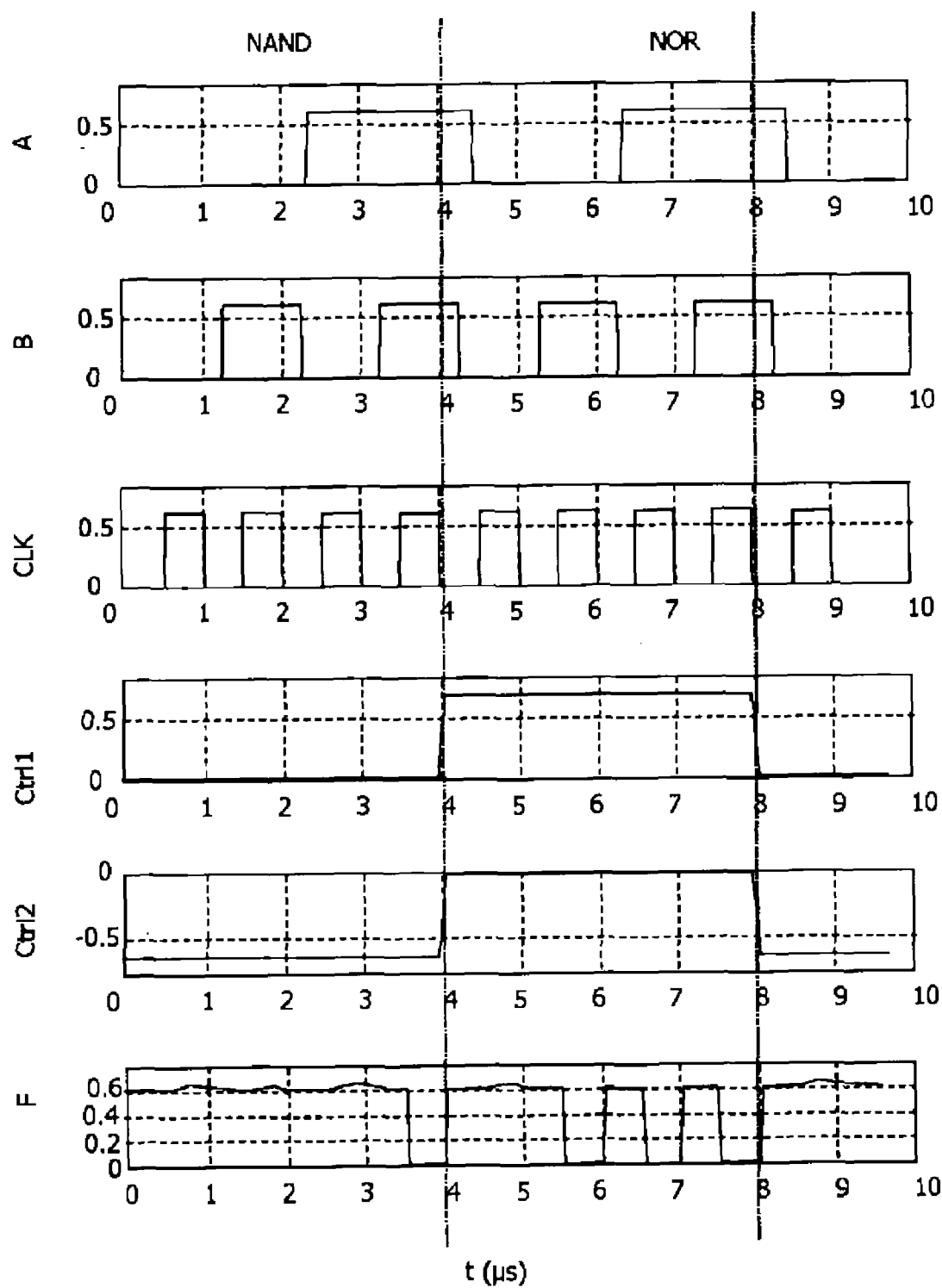
FIG. 2 is a time diagram of NAND and NOR functions obtained with a reconfigurable cell according to FIG. 1.
Figure 3:
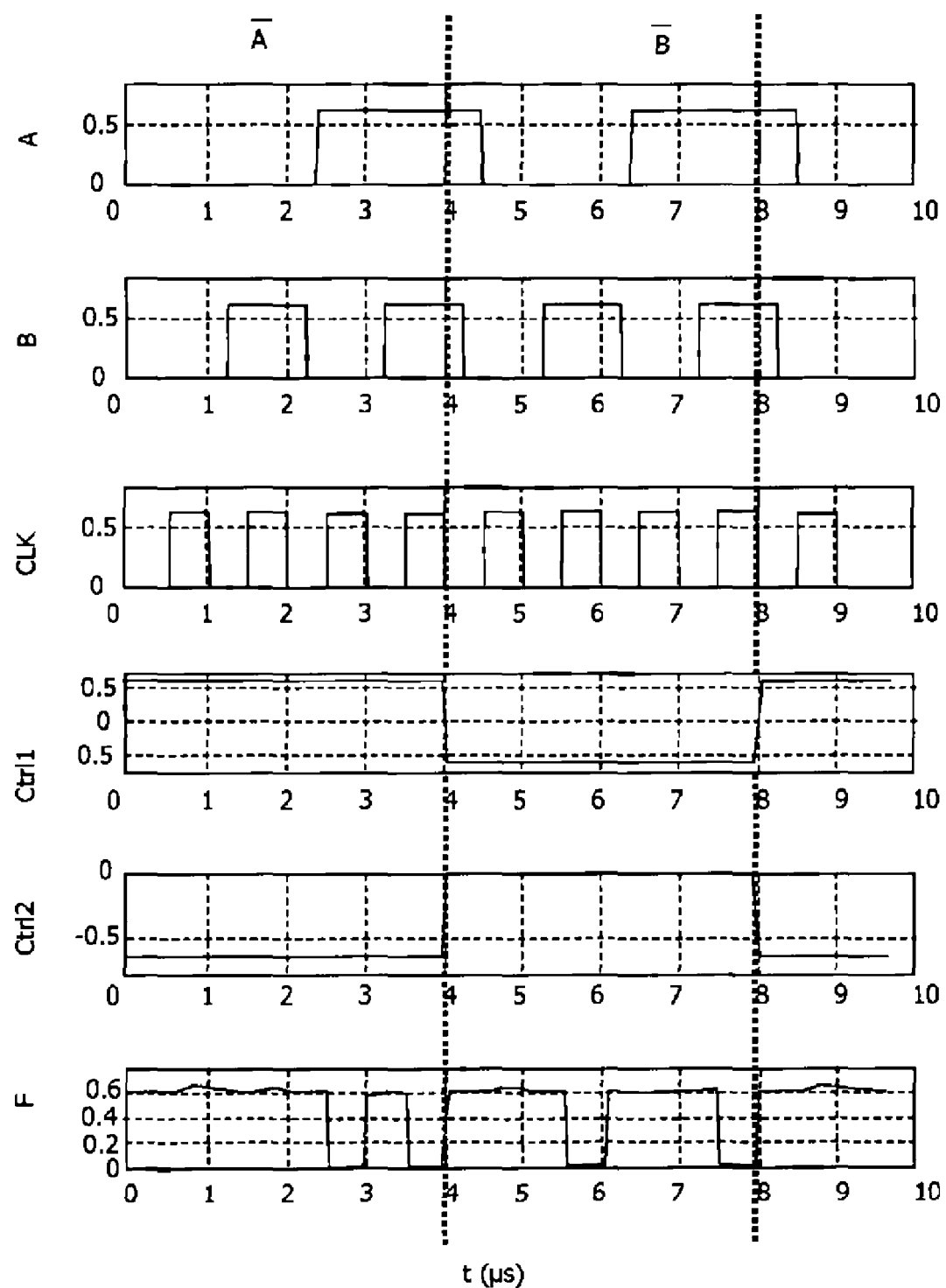
FIG. 3 is a time diagram of NON-A and NON-B functions obtained with a reconfigurable cell according to FIG. 1.

FIGS. 2 and 3 are time diagrams showing the operation of the reconfigurable cell of FIG. 1 operating with a Vdd equal to 0.6 Volts and only made from asymmetrical transistors.

On these time diagrams, the values assumed by the inputs A and B, by the clock signal CLK, by the control signals C1 and C2 as well as by the output F, are illustrated as a function of time.

The voltages of the signals are given in volts and the transistors are all asymmetrical and have front and rear gate oxide thicknesses of 3.5 nanometers and 1.2 nanometers respectively.

The transistors M1-M3 and Mn of the NMOS network all have the same size, i.e. a W/L equal to 1.6 µm/0.4 µm in the exemplary embodiment of FIG. 1. The preload P type transistor Mp as for it has a W/L equal to 1 µm/0.4 µm.

The size identity of the NMOS transistors allows simple manufacturing of the reconfigurable cell, from a set of asymmetrical transistors made at the same time. In this case, the input B applied on the transistor M3 of the second branch of the reconfigurable cell is connected to the gate having the thickest gate oxide.

In the first portion of the time diagram, the signal C1 is equal to 0 Volt while the signal C2 is equal to −Vdd=−0.6 Volt. The reconfigurable cell then produces the NAND logic function.

In this configuration, the zero voltage applied by means of signal C1 gives the transistor M2 a "normal" operating mode. This means that the transistor M2 is conducting when a logic level 1 is applied on the front gate and blocked when a zero logic level is applied on this same front gate.

The application of a signal C2 equal to −Vdd allows the transistor M3 to be completely blocked and this independently of the voltage applied on the front gate.

Such a complete blocking of the transistor M3 is only possible if this transistor is asymmetrical.

Indeed, the asymmetry is such that the threshold voltage of the front gate is increased so that when a control signal C1 equal to −Vdd is applied, regardless of the signal applied on this front gate, the transistor M3 does not become conducting in this configuration so that the NAND function may be produced.

Nevertheless, the threshold voltage of the front gate should remain sufficiently low in order to allow a normal operating mode of the transistor M3 when the signal C2 is zero.

This is notably the case in the configuration with which the NOR function may be produced, where the signal C1 has a voltage Vdd and where the signal C2 has zero voltage.

With such a signal C1, it is possible to significantly reduce the threshold voltage of a transistor M2 and to make it conducting whichever the logic state of the signal applied on its front gate.

The signal C2 of zero voltage ensures normal conduction of the transistor M3, i.e. M3 is conducting when a logic level 1 is applied on the front gate and blocked when a zero logic level is applied on the front gate of the transistor M3.

FIGS. 2 and 3 show time diagrams obtained with the reconfigurable cell of FIG. 1.

The transistor M3 is always blocked when a voltage −Vdd is applied on the rear gate. In the case of a symmetrical transistor M3, it would not be completely blocked.

By increasing the front gate oxide thickness or further by using a higher work function for the front gate, it is possible to increase the threshold voltage of the front gate in the asymmetrical transistor M3. By reducing the control on this gate, complete blocking of the transistor M3 is ensured including when the input B has a logic state of 1.

The time diagrams shown in FIGS. 2 and 3 were obtained with a rear/front gate oxide thickness difference approximately ranging from one to three times, i.e. 1.2 nanometers for the rear gate and 3.5 nanometers for the front gate.

The importance of asymmetry between both gates depends on the power supply voltage Vdd. Generally, it is observed that the ratio of the rear gate oxide thickness over the front gate oxide thickness may be lowered down to 0.5.

This means that for example under a power supply voltage Vdd equal to 0.6 Volt, with a rear gate with a thickness of 1.2 nanometers, the front gate thickness may be lowered down to about 2.4 nanometers.

This further allows a slight gain in performance since by reducing the front gate oxide thickness, it is possible to obtain a lower threshold voltage.

Figure 4:
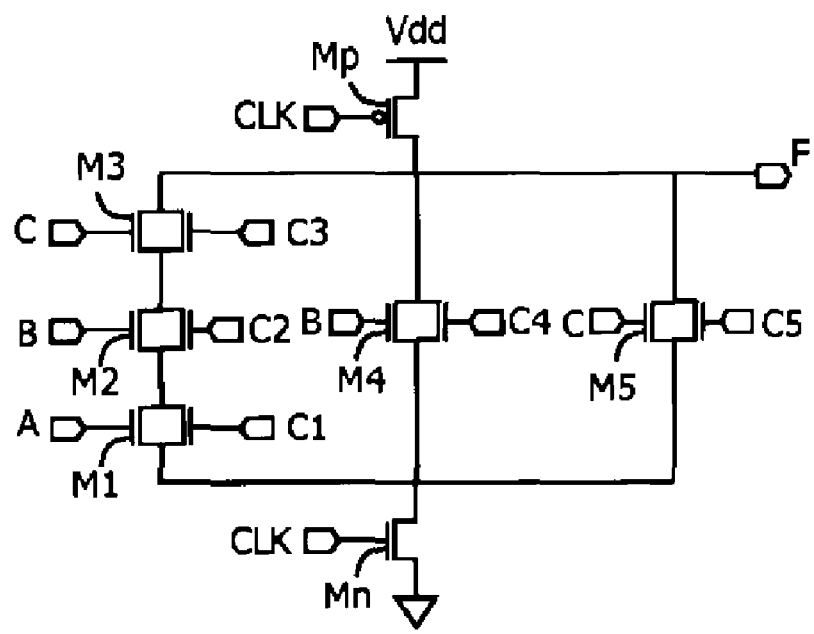
FIG. 4 illustrates a second exemplary embodiment of the reconfigurable cell made in dynamic logic according to the invention.

FIG. 4 illustrates a second exemplary embodiment of a reconfigurable cell according to the invention.

This reconfigurable cell with three inputs is capable of implementing eleven logic functions and uses seven dual gate MOSFET transistors.

More specifically, in addition to the transistors Mn and Mp with which the clock signal may be handled according to the principles of dynamic logic, three transistors M1, M2 and M3 are mounted in series on a first branch and two branches parallel to the first branch each comprise one transistor, M4 and M5 respectively.

Transistors M1-M5 on their front gates each receive an input from the three inputs A, B, C of the reconfigurable cell.

Each of these transistors is moreover connected through its rear gate to a control signal. Thus, five control signals C1-C5 are required for controlling the operating modes of the transistors M1-M5.

Table 3 illustrates the truth table of the reconfigurable cell with eleven functions as illustrated in FIG. 4;

TABLE 3

| C1 | C2 | C3 | C4 | C5 | F |
|---|---|---|---|---|---|
| 0 | 0 | 0 | −Vdd | −Vdd | $\overline{A \cdot B \cdot C}$ |
| Vdd | Vdd | 0 | 0 | 0 | $\overline{A + B + C}$ |
| Vdd | Vdd | 0 | 0 | −Vdd | $\overline{A + B}$ |
| Vdd | Vdd | 0 | −Vdd | 0 | $\overline{A + C}$ |
| Vdd | 0 | Vdd | −Vdd | 0 | $\overline{B + C}$ |
| Vdd | 0 | 0 | −Vdd | −Vdd | $\overline{A \cdot B}$ |
| 0 | 0 | Vdd | −Vdd | −Vdd | $\overline{B \cdot C}$ |
| 0 | Vdd | 0 | −Vdd | −Vdd | $\overline{A \cdot C}$ |
| Vdd | Vdd | 0 | −Vdd | −Vdd | $\overline{A}$ |
| Vdd | 0 | Vdd | −Vdd | −Vdd | $\overline{B}$ |
| 0 | Vdd | Vdd | −Vdd | −Vdd | $\overline{C}$ |

Figure 5:
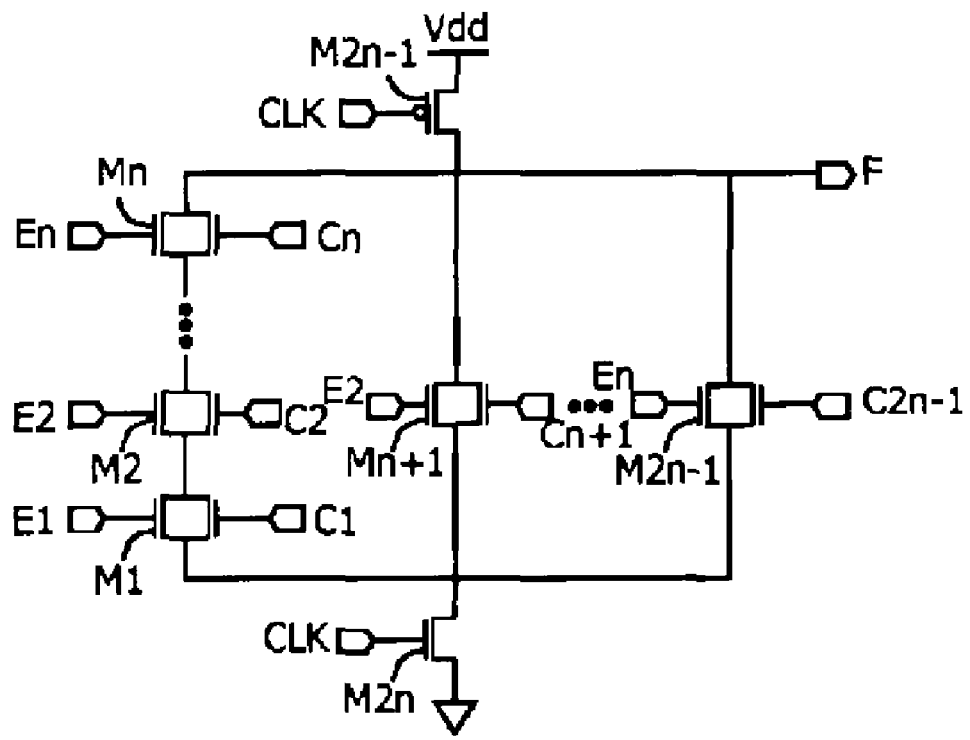
FIG. 5 illustrates a generalization of the making of a reconfigurable cell made in dynamic logic according to the invention.

FIG. 5 illustrates a generalization of the principle of the invention with which a reconfigurable cell with n inputs E1-En may be made.

The reconfigurable cell of FIG. 5 comprises a first branch bearing n dual gate MOSFET transistors with independent gates, M1-Mn.

The front gates of these n transistors M1-Mn are controlled by the n logic inputs of the network E1-En and the rear gates of these n transistors are controlled by control signals C1-Cn.

The reconfigurable cell further comprises n−1 branches parallel to the first branch and each comprising an asymmetrical dual gate MOSFET transistor Mn+1-M2n−1, for example having a front gate oxide thickness greater than the thickness of the rear gate oxide.

The front gates of these transistors are each connected to one of the n−1 inputs E2-En.

2n−1 control signals C1-C2n−1 of the rear gates of all these transistors are required for controlling the configurations of the reconfigurable cell.

It is seen that the reconfigurable cells made in dynamic logic shown in the previous figures are particularly compact. Indeed, the dynamic structure does not require any complementary networks of type P and therefore large compactness may therefore be retained.

The absence of the complementary network also allows reduction in the parasitic capacitances and allows a higher speed as compared with the complementary static structure.

Nevertheless, static logics generally have better immunity to noise than dynamic logics and are therefore particularly interesting for applications where temperature may vary significantly.

CMOS static logic (SCMOS) requires, in addition to the NMOS network shown in the previous figures, a network of the complementary P type.

In spite of the bulkiness generated by such a PMOS complementary network in terms of surface area and parasitic capacitance, in the case of implementation of logic functions with a large number of inputs, static logic may be of interest in military applications or further in applications used in oil wells.

Figure 6:
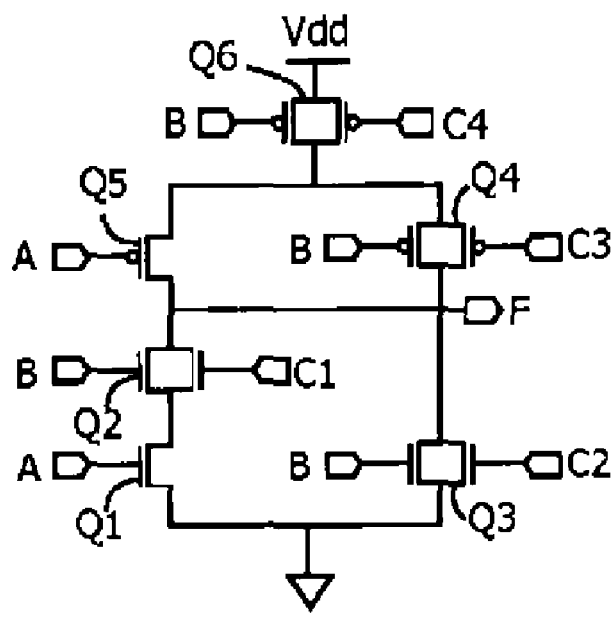
FIG. 6 illustrates an embodiment of a reconfigurable cell made in static logic of the invention.

FIG. 6 shows a reconfigurable static cell with four logic functions. It is made from six transistors.

In this reconfigurable cell, both branches used in dynamic logic with the output F made on the point common to both branches, the most distant from the ground. The first branch bears two symmetrical or asymmetrical transistors Q1 and Q2 in series, the second one preferentially an asymmetrical transistor Q3.

A complementary network of PMOS transistors Q4, Q5 and Q6 is implemented between the output F and the power supply terminal Vdd. In this network, when one corresponding NMOS branch is blocked, the complementary PMOS branch(es) is (are) conducting.

The transistors Q4 and Q5 are connected in parallel with each other and placed in series with the transistor Q6 connected to the power supply terminal. The output F is therefore located at the point common to both transistor networks.

The transistor Q5 is a symmetrical or asymmetrical dual gate MOSFET transistor of type P where the gates are connected together.

The transistors Q4 and Q6 are PMOS asymmetrical dual gate MOSFET transistors with separate gates, controlled by two control signals C3 and C4 on their rear gate.

The input A is connected to the connected gates of the transistor Q5.

The input B is connected to the front gates of the transistors Q4 and Q6.

The reconfigurable cell, illustrated in FIG. 6, may be made from exclusively symmetrical transistors or exclusively asymmetrical transistors.

In the example proposed in FIG. 6, the dimensions of the transistors are W/L=1.6 μm/0.4 μm for the transistors Q1, Q2 and Q3, W/L=3.2 μm/0.4 μm for the transistors Q5 and Q6 and W/L=0.8 μm/0.5 μm for the transistor Q4.

Except if the cell operates under a power supply voltage Vdd greater than 0.6 Volts, the use of symmetrical transistors for the whole reconfigurable static cell allows proper operation.

Indeed it is required that the ratio of the power supply voltage Vdd over the threshold voltage Vs of the transistors Q3 and Q4 be sufficiently low and this is the case when Vdd is equal to 0.6 Volts and the threshold voltage of the symmetrical device is equal to about 0.4 Volts. With this smallness of the Vdd/Vs ratio, by itself, it is possible to ensure blocking of the transistor Q3 by exclusively applying the voltage −Vdd on the rear gate.

As regards the transistor Q4, the use of a small W/L ratio and of a relatively small Vdd/Vs ratio, with adequate control on the rear gate, is sufficient for ensuring blocking and therefore proper functionality of the cell.

Nevertheless, in the case when the interest lies in reconfigurable static cells more oriented towards high speed than low consumption, it is then useful to select a power supply voltage close to the maximum voltage specified by the transistor manufacturer. The power supply voltage may then for example be equal to 1.2 Volts.

In such a case, and as soon as the power supply voltage is greater than 0.6 Volts, the use of asymmetrical dual gate MOSFET transistors for transistors Q3 and Q4 is required in order to enable blocking in the configurations requiring this, regardless of the voltage provided on their front gate. In such a case, as for the cell implemented in dynamic logic, the whole of the cell may also be made with asymmetrical transistors exclusively.

The adjustment of the front gate oxide thickness/rear gate oxide thickness ratios of the asymmetrical transistors is advantageously selected so as to observe this blocking condition while maintaining the voltages Vgs and Vgd of the relevant transistors lower than 1.2 Volts in order to avoid any risk of breakdown of the gate oxides.

Table 4 illustrates the truth table of the reconfigurable static cell of FIG. 6 with which four logic functions may be produced, each of the available functions corresponding to a given configuration depending on the state of the control signals C1-C4.

TABLE 4

| C1 | C2 | C3 | C4 | F |
|---|---|---|---|---|
| Vdd | −Vdd | Vdd | −Vdd | $\overline{A}$ |
| −Vdd | 0 | −Vdd | Vdd | $\overline{B}$ |
| 0 | −Vdd | Vdd | −Vdd | $\overline{A \cdot B}$ |
| Vdd | 0 | Vdd | Vdd | $\overline{A + B}$ |

The four implemented logic functions are identical to those shown for the reconfigurable cell of FIG. 1.

With the operation of the reconfigurable cell of FIG. 6, it is therefore possible to produce four logic functions: NON-A, NON-B, NAND and NOR.

In the NON-A configuration, the signal C1 has a voltage equal to Vdd, so as to make the transistor Q2 conducting regardless of the voltage applied on the front gate of Q2, therefore regardless of the logical state of the signal B. The signal C2 has a voltage equal to −Vdd, so as to block transistor Q3, regardless of the voltage applied on the front gate, i.e. regardless of the logic state of the signal B. As the transistor Q3 is asymmetrical, it is therefore completely blocked in this way.

The signal C3 has a voltage equal to Vdd in order to block the PMOS transistor Q4 permanently. In reality, the blocking of the transistor Q4 depends on the biasing of the transistor Q4 itself and on the biasing of the transistor(s) in series on the same branch. If need be, transistor Q4 is selected to be asymmetrical. Such a device Q4 then for example has a greater front gate oxide thickness than the rear gate oxide thickness.

The signal C4 has a voltage equal to −Vdd in order to ensure that the transistor Q6 is conducting independently of the logic state of the input B which is applied on its front gate.

Figure 7:
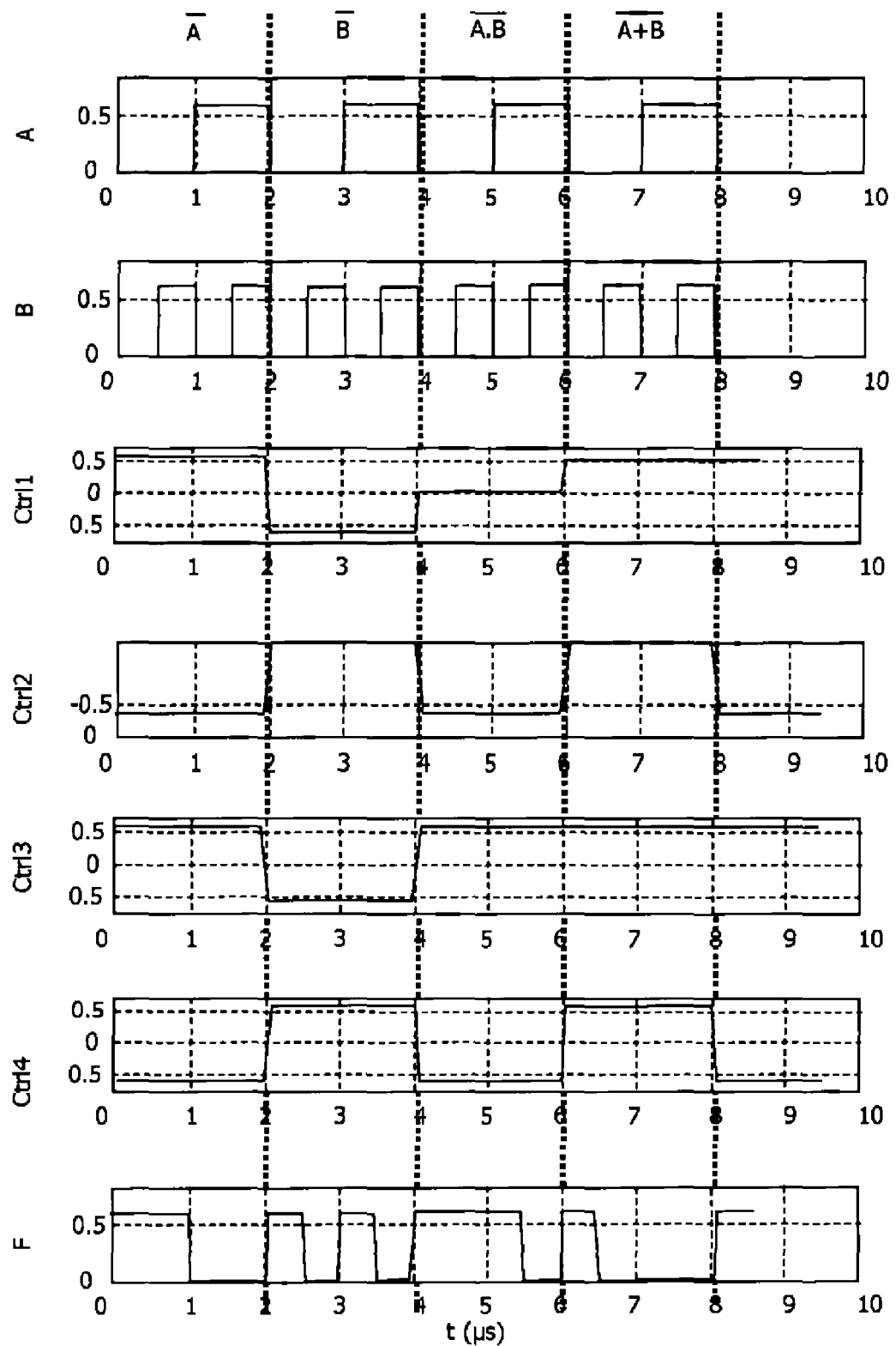
FIG. 7 is a time diagram of NAND, NOR, NON-A and NON-B functions obtained with a reconfigurable cell in static logic according to FIG. 6.

FIG. 7 illustrates a time diagram of the reconfigurable static cell with four functions of FIG. 6 for each of the four functions produced by this cell. Producing these functions requires the possibility of making these transistors capable of conducting the current or blocking it regardless of the logic state on the front gate with a voltage applied on the rear gate.

For the NON-B configuration, the control signal C1 has a voltage −Vdd for blocking the branch on which is found the NMOS type transistor Q1 controlled by input A. The control signal C2 is taken equal to 0 Volts in order to ensure normal conduction of the transistor Q3.

In order to ensure conduction of the transistor Q4 regardless of the logic state of the input B, the control signal C3 is taken to be equal to −Vdd in order to significantly reduce the threshold voltage of the transistor Q4 and to reduce its resistance $R_{ON}$. The transistor Q4 is then conducting regardless of the logic state of the input B.

Finally, the control signal C4 is taken to be equal to Vdd in order to ensure normal conduction of transistor Q6, i.e. this transistor is conducting when a logic state 0 is provided on its front gate and blocked when a logic state 1 is provided on its front gate.

In order to produce the NAND function, the control signal C1 has a voltage equal to 0 Volts in order to ensure normal conduction of transistor Q2, the signal C2 has a voltage equal to −Vdd so as to block transistor Q3 if need be, in combination with an asymmetrical structure of this transistor. The control signal C3 has a voltage equal to Vdd in order to ensure normal conduction of transistor Q4 and the control signal C4 has a voltage equal to −Vdd so as to make transistor Q6 conducting regardless of the voltage applied on its front gate and therefore regardless of the logic state of the input B.

Finally, in order to produce the NOR function, the control signal C1 has a voltage equal to Vdd in order to ensure conduction of transistor Q2, regardless of the voltage applied on the front gate of this transistor. The control signal C2 is taken to be of zero voltage in order to ensure normal behavior of transistor Q3, depending on the logic states taken by the input B. The control signal C3 is taken to have a voltage equal to Vdd ensuring permanent blocking of transistor Q4 if need be in combination with an adjustment of its dimensions and an asymmetrical character of this transistor. For example, the gate oxide thickness controlled by the input B may be increased. The threshold voltage of the transistor Q4 is thereby increased and operation under blocking conditions is obtained.

The control signal C4 is finally taken to have a voltage equal to Vdd in order to ensure normal conduction of transistor Q6.

Figure 8:
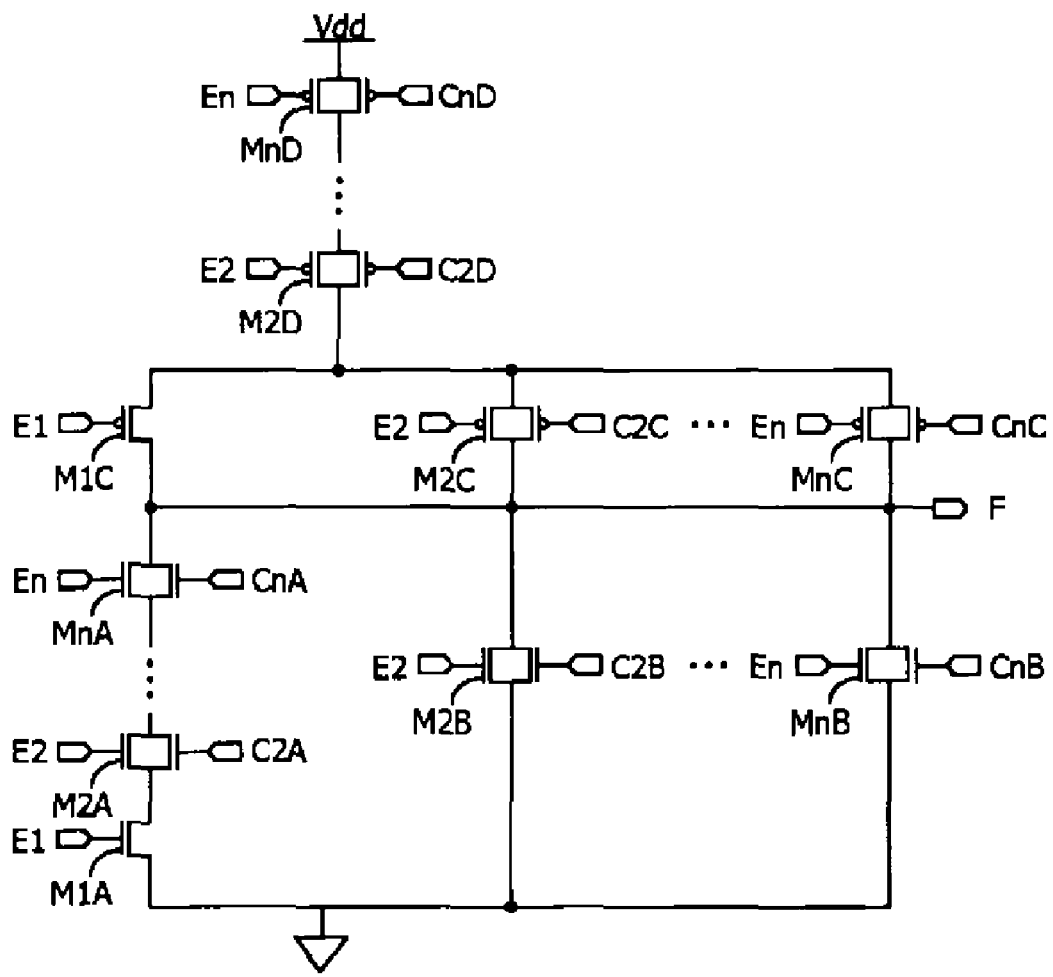
FIG. 8 illustrates a generalization of the making of a reconfigurable cell made in static logic according to the invention.

FIG. 8 illustrates a generalization of the principle of the invention with which a reconfigurable static cell with n inputs E1-En may be made.

The reconfigurable cell of FIG. 8 comprises a first branch bearing n MOSFET transistors in series M1-MnA.

The transistor M1A is a symmetrical dual gate MOSFET transistor with the front and rear gates connected together, while the n−1 transistors M2A-MnA are symmetrical dual gate MOSFET transistors with separate gates.

Both gates of the transistor M1A are controlled by the logic input of the network E1. The front gates of the n−1 transistors M2A-MnA are controlled by n−1 logic inputs of the network E2-En, while the rear gates of these n−1 transistors are controlled by control signals C2A-CnA.

The reconfigurable cell further comprises n−1 branches parallel to the first branch and each comprising a MOSFET transistor M2B-MnB.

The n−1 transistors M2B-MnB are preferentially asymmetrical dual gate MOSFET transistors with separate gates.

The front gates of the n−1 transistors M2B-MnB are controlled by the n−1 logic inputs of the network E2-En, while the rear gates of these n−1 transistors are controlled by control signals C2B-CnB.

The output F is made on the point common to the n branches, the most distant from the ground.

A complementary network of PMOS transistors is implemented between the output F and the power supply terminal Vdd. In this network, when a corresponding NMOS branch is blocked, the complementary PMOS branch(es) is (are) conducting.

This complementary network comprises n transistors M1C-MnC connected in parallel with each other and placed in series with n−1 transistors M2D-MnD, MnD being connected to the power supply terminal.

The output F is therefore located at the common point of both transistor networks.

The M1C transistor is a symmetrical or asymmetrical dual gate MOSFET transistor of type P, the gates of which are connected together, while the n−1 transistors M2C-MnC are asymmetrical PMOS dual gate MOSFET transistors with separate gates.

Both gates of transistor M1C are controlled by the logic input of the network E1. The front gates of the n−1 transistors M2C-MnC are controlled by the n−1 logic inputs of the network E2-En, while the rear gates of these n−1 transistors are controlled by control signals C2C-CnC.

The transistors M2D-MnD are symmetrical PMOS dual gate MOSFET transistors, with separated gates. The front gates of the n−1 transistors M2D-MnD are controlled by the n−1 logic inputs of the network E2-En, while the rear gates of these n−1 transistors are controlled by control signals C2D-CnD.

It should be noted that the reconfigurable cell illustrated in FIG. 8 may exclusively be made from symmetrical transistors or exclusively from asymmetrical transistors.

4(n−1) control signals (C2A-can, C2B-CnB, C2C-CnC and C2D-CnD) of the rear gates of all these transistors are required for controlling the configurations of the reconfigurable cell.

Finally it is noted that various applications may be achieved according to the principles of the invention defined in the following claims.

What is claimed is:

1. A reconfigurable logic cell comprising n inputs (A, B, . . . ), n being greater than or equal to 2, and capable of producing at least four logic functions with which logic signals provided on the n inputs (A,B, . . . ) may be processed, characterized in that it comprises, between the ground and the output (F) of the cell, at least one first branch including n dual gate N type MOSFET transistors (M1,M2, . . . ) in series and n−1 branches in parallel with the first branch, each provided with one dual gate N type MOSFET transistor (M3), each of the logic functions corresponding to a given configuration of the cell wherein a specific set of control signals (C1,C2, . . . ) is applied on the rear gates of at least one portion of the transistors (M2,M3, . . . ), each control signal (C1,C2, . . . ) being capable of setting the transistor (M2,M3, . . . ) to a particular operating mode, the n inputs (A,B, . . . ) being each connected on the front gate of one of the n transistors (M1, M2, . . . ) of the first branch, n−1 inputs (B) being also applied on the front gate of one (M3) of the n−1 transistors of the n−1 branches in parallel with the first branch.

2. The reconfigurable cell according to claim 1, characterized in that n is equal to 2, a first input (A) being connected to the connected gates of a first transistor (M1) of the first branch, a second input (B) being connected to the front gate of the second transistor (M2) of the first branch, the gates of which are separate, and to the front gate of the transistor (M3) of the second branch, the gates of which are also separate; control signals (C1,C2) applied on the rear gates of the second transistor (M2) of the first branch and of the transistor (M3) of the second branch enabling the reconfigurable cell to be made capable of performing four functions.

3. The reconfigurable cell according to claim 1, characterized in that n is equal to 2, all the transistors being with separate gates, a first input (A) being connected to the front gate of a first transistor (M1) of the first branch, a second input (B) being connected to the front gate of a second transistor (M2) of the first branch and to the front gate of the transistor of the second branch (M4), a third input (C) being connected to the front gate of the third transistor (M3) of the first branch and to the front gate of the transistor (M5) of the third branch, five control signals (C1 to C5) applied on the rear gates of the five transistors (M1 to M5) enables the reconfigurable cell to be made capable of performing eleven functions.

4. The reconfigurable cell according to claim 1, characterized in that the control signals (C1,C2, . . . ) have a voltage selected from −Vdd, 0, +Vdd, Vdd being the power supply voltage of the cell.

5. The reconfigurable cell according to claim 1, characterized in that it is implemented in dynamic logic, the branches of the cell being placed in series, between the ground and a power supply terminal, between a preload transistor of the P type (Mp) and an evaluation transistor of the N type (Mn), the gates of which are controlled by a clock signal and in that the transistors (M3,M4 and M5) of the n−1 branches in parallel with the first branch are asymmetrical.

6. The reconfigurable cell according to claim 5, characterized in that all the transistors are asymmetrical.

7. The reconfigurable cell according to claim 5, characterized in that the asymmetry of the transistors is such that it allows increase in the threshold voltage of the front gate, controlled by the input logic signal, relatively to that of the rear gate, controlled by the control signal of the logic function of the cell.

8. The reconfigurable cell according to claim 5, characterized in that the asymmetry of the transistor(s) is selected so as to ensure a compromise between the stability of the operating modes of the transistor(s) and the functions produced by the cell with bias voltages below the gate breakdown limit of the transistor(s).

9. The reconfigurable cell according to claim 1, characterized in that it is implemented in static logic, the branches of the cell being placed in series between the ground and a power supply terminal (Vdd) with a complementary network of transistors placed between the point common to the branches of the cell, the most distant from the ground, forming the output (F) of the cell, and the power supply terminal (Vdd).

10. The reconfigurable cell according to claim 9, characterized in that n is equal to 2, and the complementary network comprises, between the power supply terminal and the output (F) of the cell, a P type MOSFET transistor (Q6) in series with two P type MOSFET transistors (Q4,Q5) placed in parallel with each other and both connected to the output (F) of the cell, the first input (A) being connected to the connected gates of a first P type transistor (Q5) placed in parallel, the second input (B) being connected to the front gate of the second P type transistor (Q4) placed in parallel, the gates of which are separate, and to the front gate of the P type transistor (Q6) placed in series, the gates of which are also separate; two control signals (C3,C4) applied on the rear gates of the second P type transistor (Q4) placed in parallel and of the P type transistor (Q6) placed in series enabling the reconfigurable cell to be made capable of performing four functions.

11. The reconfigurable cell according to claim 10, characterized in that as the transistors are all symmetrical, the W/L ratio of the P type transistor (Q4) with separate gates placed in parallel is adjusted so as to allow blocking of this transistor when a voltage Vdd is applied on its rear gate.

12. The reconfigurable cell according to claim 10, characterized in that the P type transistor (Q4) with separate gates placed in parallel is asymmetrical.

13. The reconfigurable cell according to claim 12, characterized in that all the transistors are asymmetrical.

14. The reconfigurable cell according to claim 1, characterized in that the asymmetrical gates have different gate oxide thicknesses.

15. The reconfigurable cell according to claim 1, characterized in that the asymmetrical gates are such that they have asymmetrical work functions.

\* \* \* \* \*